(12) United States Patent
Hao et al.

(10) Patent No.: US 10,693,447 B1
(45) Date of Patent: Jun. 23, 2020

(54) COMPARATOR CIRCUIT (71) Applicant: Artery Technology Co., Ltd., Chongqing (CN)

(72) Inventors: Baotian Hao, Chongqing (CN); Weitie Wang, Chongqing (CN); Chao Li, Chongqing (CN)

(73) Assignee: Artery Technology Co., Ltd., Chongqing (CN)

( * ) Notice: Subject to any disclaimer, the term of this patent is extended or adjusted under 35 U.S.C. 154(b) by 0 days.

(21) Appl. No.: 16/671,137

(22) Filed: Oct. 31, 2019

(30) Foreign Application Priority Data

Apr. 24, 2019 (CN) .......................... 2019 1 0332533

(51) Int. Cl.
*H03K 5/24* (2006.01)
(52) U.S. Cl.
CPC .................................. *H03K 5/2472* (2013.01)
(58) Field of Classification Search
CPC ....................................................... H03K 5/24
See application file for complete search history.

(56) References Cited

U.S. PATENT DOCUMENTS

| | | | | |
|---|---|---|---|---|
| 5,488,321 | A * | 1/1996 | Johnson ................... | H03F 3/345 327/312 |
| 8,476,935 | B2 * | 7/2013 | Wolf ........................ | H03K 5/08 327/563 |
| 10,056,892 | B2 * | 8/2018 | Nicollini ............. | H03F 3/45273 |
| 10,491,205 | B2 * | 11/2019 | Remple ................... | G05F 1/565 |
| 10,574,221 | B2 * | 2/2020 | Wang .................... | H03K 5/2481 |

* cited by examiner

*Primary Examiner* — Patrick O Neill
(74) *Attorney, Agent, or Firm* — Winston Hsu (57) ABSTRACT

A comparator circuit includes: a comparator, coupled between a power voltage and a ground voltage, configured to perform a comparison according to a set of input signals to generate a comparison signal; a current source; and positive feedback circuits. The comparator circuit includes a set of input terminals and sets of transistors respectively coupled between a power voltage and a node or a ground voltage. The positive feedback circuits perform positive feedback operations on the node to generate instant currents on the node, to make the comparator switch the comparison signal in response to transition of the set of input signals in real time. Any of the positive feedback circuits includes: a first switch, configured to enable or disable said any positive feedback circuit in response to transition of the comparison signal; and a set of transistors, configured to generate a second current corresponding to the first current.

10 Claims, 6 Drawing Sheets

COMPARATOR CIRCUIT

BACKGROUND OF THE INVENTION

1. Field of the Invention

The present invention is related to electronic circuits, and more particularly, to a comparator circuit.

2. Description of the Prior Art

Conventional comparators have certain disadvantages; in particular, a conventional comparator is typically trapped in a tradeoff between speed and power. In addition, capacitors are required to implement the conventional comparator with a capacitor-coupling dynamic biased architecture, which may reduce area efficiency of the circuit architecture, as well as increasing related costs. Moreover, the capacitor-coupling dynamic biased comparator needs powerful driving ability regarding its input, and is sensitive to noise and amplitude of input signals.

Thus, there is a need for a novel architecture to improve overall performance of an electronic system without introducing any side effector in away that is less likely to introduce side effects.

SUMMARY OF THE INVENTION

An objective of the present invention is to provide a comparator circuit which solves the aforementioned problem.

Another objective of the present invention is to provide a comparator circuit that can achieve optimal performance of an electronic device without introducing any side effect or in a way that is less likely to introduce side effects.

Yet another objective of the present invention is to provide a comparator circuit that can break through the tradeoff between speed and power.

At least one embodiment of the present invention provides a comparator circuit. The comparator circuit may comprise: a comparator, coupled between a power voltage and a ground voltage, configured to perform a comparison according to a set of input signals to generate at least one comparison signal; a current source; and a plurality of positive feedback circuits. The comparator may comprise: a set of input terminals, configured to receive the set of input signals; a first set of transistors, coupled between the power voltage and a node, wherein a first terminal, a second terminal and a control terminal of a transistor within the first set of transistors are respectively coupled to a second terminal of another transistor within the first set of transistors, the node and an input terminal within the set of input terminals, and a first terminal of the other transistor within the first set of transistors is coupled to the power voltage; a second set of transistors, coupled between the power voltage and the node, wherein a first terminal, a second terminal and a control terminal of a transistor within the second set of transistors are respectively coupled to a second terminal of another transistor within the second set of transistors, the node and another input terminal within the set of input terminals, and a first terminal of the other transistor within the second set of transistors is coupled to the power voltage; a third set of transistors, coupled between the power voltage and the ground voltage, wherein a first terminal, a second terminal and a control terminal of a transistor within the third set of transistors are respectively coupled to a second terminal of another transistor within the third set of transistors, the ground voltage and an output stage of the comparator, and a first terminal and a control terminal of the other transistor within the third set of transistors are respectively coupled to the power voltage and a control terminal of the other transistor within the first set of transistors; and a fourth set of transistors, coupled between the power voltage and the ground voltage and positioned in the output stage, wherein a first terminal, a second terminal and a control terminal of a transistor within the fourth set of transistors are respectively coupled to a second terminal of another transistor within the fourth set of transistors, the ground voltage and the control terminal of the transistor within the third set of transistors, and a first terminal and a control terminal of the other transistor within the fourth set of transistors are respectively coupled to the power voltage and a control terminal of the other transistor within the second set of transistors. In addition, the current source may be coupled between the node and the ground voltage, and may be configured to provide current. The plurality of positive feedback circuits may be coupled between the power voltage and the ground voltage and coupled to the node, and may be configured to perform a plurality of positive feedback operations on the node to generate a plurality of instant currents on the node, respectively, to make the comparator switch said at least one comparison signal in response to a transition of the set of input signals in real time. In addition, any positive feedback circuit within the positive feedback circuits may comprise: a first switch, coupled to the node, configured to enable or disable said any positive feedback circuit in response to a transition of said at least one comparison signal, wherein when said any positive feedback circuit is enabled, a first current flows through the first switch; and a set of transistors, coupled between the power voltage and the ground voltage, configured to generate the first current and a second current corresponding to each other, wherein an instant current within the instant currents corresponds to the second current.

The comparator circuit of the present invention can break through the tradeoff between speed and power in order to achieve optimal performance of the electronic device without introducing any side effect or in a way that is less likely to introduce side effects. In addition, the comparator circuit can provide instant currents through the positive feedback architecture to make the comparator switch an output signal such as said at least one comparison signal in response to a transition of input signals in real time, and thereby achieve an extremely high response speed. In comparison with the related art, the comparator circuit of the present invention has both great function and small size.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
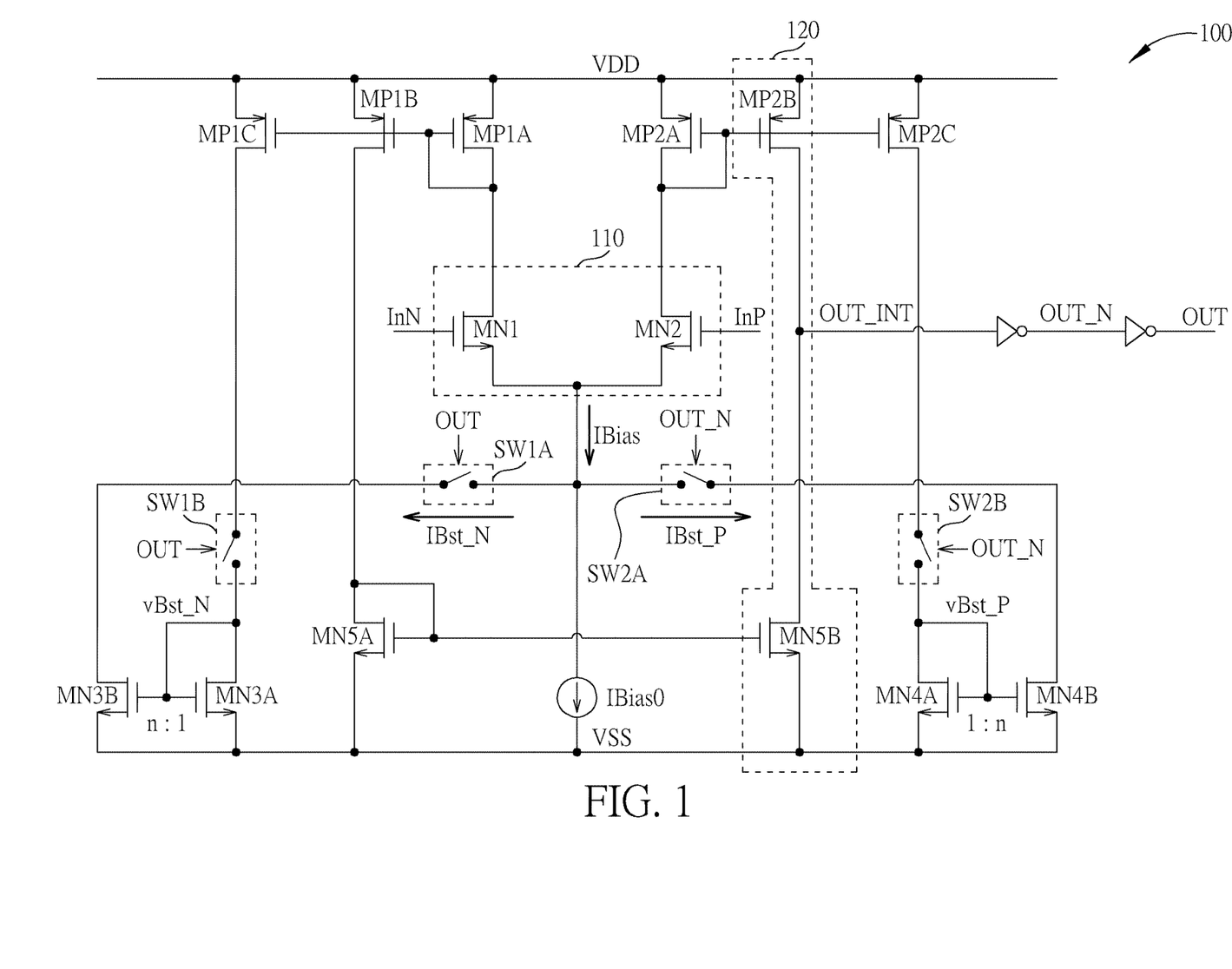
FIG. 1 is a diagram illustrating a comparator circuit according to an embodiment of the present invention.

FIG. 1 is a diagram illustrating a comparator circuit 100 according to an embodiment of the present invention. The comparator circuit 100 may comprise: a comparator coupled between a power voltage VDD and a ground voltage VSS, where the comparator may comprise a plurality of transistors MN1, MN2, MP1A, MP1B, MP2A, MP2B, MN5A and MN5B positioned on a plurality of vertical current paths in the middle of the architecture as shown in FIG. 1, where an input stage 110 of the comparator may comprise transistors MN1 and MN2, and an output stage 120 of the comparator may comprise transistors MP2B and MN5B; a plurality of inverters, coupled to the output stage 120, configured to buffer a comparator output (e.g. an output signal of the output stage 120); a current source generating a current IBias0; and a plurality of positive feedback circuits coupled between the power voltage VDD and the ground voltage VSS, where the positive feedback circuits may comprise a plurality of transistors MP1C, MP2C, MN3A, MN3B, MN4A and MN4B positioned on a plurality of vertical current paths in a left side and a right side of the architecture shown in FIG. 1, and may comprise switches SW1A, SW1B, SW2A and SW2B. As shown in FIG. 1, the switches SW1A and SW2A and the current source generating the current IBias0 may be coupled to a common node, such as a node between the switches SW1A and SW2A, and may be coupled to the input stage 110 (more particularly, the transistors MN1 and NM2 therein) via the node. For better comprehension, the current IBias flowing to the node from the input stage 110 may comprise a plurality of sub-currents, such as the currents IBias0, IBst_N and IBst_P, but the present invention is not limited thereto. The architecture shown in FIG. 1 uses certain types of Metal Oxide Semiconductor Field Effect Transistors (MOSFETs), such as P-type MOSFETs and N-type MOSFETs, but the present invention is not limited thereto.

As shown in FIG. 1, the comparator may comprise a set of input terminals, such as a left terminal and a right terminal of the input stage 110, where the set of input terminals may be respectively coupled to control terminals of the transistors MN1 and MN2 (such as gate terminals thereof). The comparator may comprise a first set of transistors MN1 and MP1A and a second set of transistors MN2 and MP2A coupled between the power voltage VDD and the node, and may further comprise a third set of transistors MN5A and MP1B and a fourth set of transistors MN5B and MP2B coupled between the power voltage VDD and the ground voltage VSS. For example, a first terminal, a second terminal and a control terminal (e.g. a drain terminal, a source terminal and a gate terminal) of the transistor MN1 within the first set of transistors MN1 and MP1A may be respectively coupled to a second terminal (e.g. a drain terminal) of another transistor MP1A within the first set of transistors MN1 and MP1A, the node and an input terminal within the set of input terminals (e.g. the left terminal of the input stage 110), and a first terminal of the transistor MP1A (e.g. the source terminal thereof) may be coupled to the power voltage VDD; a first terminal, a second terminal and a control terminal (e.g. a drain terminal, a source terminal and a gate terminal) of the transistor MN2 within the second set of transistors MN2 and MP2A may be respectively coupled to a second terminal (e.g. a drain terminal) of another transistor MP2A within the second set of transistors MN2 and MP2A, the node and another input terminal within the set of input terminals (e.g. the right terminal of the input stage 110), and a first terminal (e.g. a source terminal) of the transistor MP2A may be coupled to the power voltage VDD; a first terminal, a second terminal and a control terminal (e.g. a drain terminal, a source terminal and a gate terminal) of the transistor MN5A within the third set of transistors MN5A and MP1B may be respectively coupled to a second terminal (e.g. a drain terminal) of another transistor MP1B within the third set of transistors MN5A and MP1B, the ground voltage VSS and the output stage 120 of the comparator, and a first terminal and a control terminal (e.g. a source terminal and a gate terminal) of the transistor MP1B may be respectively coupled to the power voltage VDD and a control terminal (e.g. a gate terminal) of the transistor MP1A within the first set of transistors MN1 and MP1A; and a first terminal, a second terminal and a control terminal (e.g. a drain terminal, a source terminal and a gate terminal) of the transistor MN5B within the fourth set of transistors MN5B and MP2B may be respectively coupled to a second terminal (e.g. a drain terminal) of another transistor MP2B within the fourth set of transistors MN5B and MP2B, the ground voltage VSS and the control terminal (e.g. the gate terminal) of the transistor MN5A within the third set of transistors MN5A and MP1B, and a first terminal and a control terminal of the transistor MP2B (e.g. the source terminal and the gate terminal thereof) may be respectively coupled to the power voltage VDD and a control terminal (e.g. a gate terminal) of the transistor MP2A within the second set of transistors MN2 and MP2A.

Based on the architecture shown in FIG. 1, the input stage 110 of the comparator may also be utilized as an input stage of the comparator circuit 100, and the output stage of the comparator circuit 100 may comprise the output stage 120 of the comparator and the inverters coupled to the output stage 120. In addition, the control terminal and the second terminal of the transistor MP1A (such as the gate terminal and the drain terminal thereof) within the first set of transistors MN1 and MP1A may be coupled to each other, to make the transistor MP1A be configured as a diode-connected transistor. The control terminal and the second terminal of the transistor MP2A (such as the gate terminal and the drain terminal thereof) within the second set of transistors MN2 and MP2A may be coupled to each other, to make the transistor MP2A be configured as a diode-connected transistor.

According to this embodiment, the comparator may perform a comparison according to a set of input signals InN and InP to generate at least one comparison signal (e.g. one or more comparison signals such as comparison signals OUT_INT, OUT_N and OUT), where the set of input terminals (e.g. the left terminal and the right terminal of the input stage 110) may be configured to receive the set of input signals InN and InP. The current source may be coupled between the node and the ground voltage VSS, and may be configured to provide the current IBias0. The comparator circuit 100 may utilize the transistors MN1, MN2, MP1A, MP1C, MN3A and MN3B and the switches SW1A and SW1B to generate a first positive feedback, and may utilize the transistors MN1, MN2, MP2A, MP2C, MN4A and MN4B and the switches SW2A and SW2B to generate a second positive feedback. In addition, the positive feedback circuits may be coupled to the node, and may be configured to perform a plurality of positive feedback operations on the node to generate a plurality of instant currents on the node, respectively, to make the comparator switch the aforementioned at least one comparison signal (e.g. the comparison signals OUT_INT, OUT_N and OUT) in response to a transition of the set of input signals InN and InP in real time. In this embodiment, the positive feedback circuits may comprise a first positive feedback circuit and a second positive feedback circuit coupled between the power voltage VDD and the node, where the first positive feedback circuit may comprise the transistors MP1C, MN3A and MN3B and the switches SW1A and SW1B, and the second positive feedback circuit may comprise the transistors MP2C, MN4A and MN4B and the switches SW2A and SW2B. The first positive feedback circuit may perform a first positive feedback operation within the positive feedback operations on the node to generate a first instant current within the instant currents on the node, and the second positive feedback circuit may perform a second positive feedback operation within the positive feedback operations on the node to generate a second instant current within the instant currents on the node. The first instant current and the second instant current may respectively correspond to a first transition and a second transition of the set of input signals InN and InP, such as the transition of changing from the input signal InP being less than the input signal InN (e.g. the state of InP<InN) to the input signal InP being greater than the input signal InN (e.g. the state of InP>InN), and the transition of changing from the input signal InP being greater than the input signal InN (e.g. the state of InP>InN) to the input signal InP being less than the input signal InN (e.g. the state of InP<InN), but the present invention is not limited thereto.

Based on the architecture shown in FIG. 1, the comparator circuit 100 may break through the tradeoff between speed and power, to achieve optimal performance of an electronic device without introducing any side effect or in a way that is less likely to introduce side effects. More particularly, via any positive feedback circuit within the positive feedback circuits (such as any of the first positive feedback circuit and the second positive feedback circuit), the comparator circuit 100 can provide corresponding instant currents to make the comparator switch an output signal (e.g. the aforementioned at least one comparison signal) in response to the transition of the set of input signals InN and InP in real time, and thereby achieve an extremely high response speed.

Figure 2:
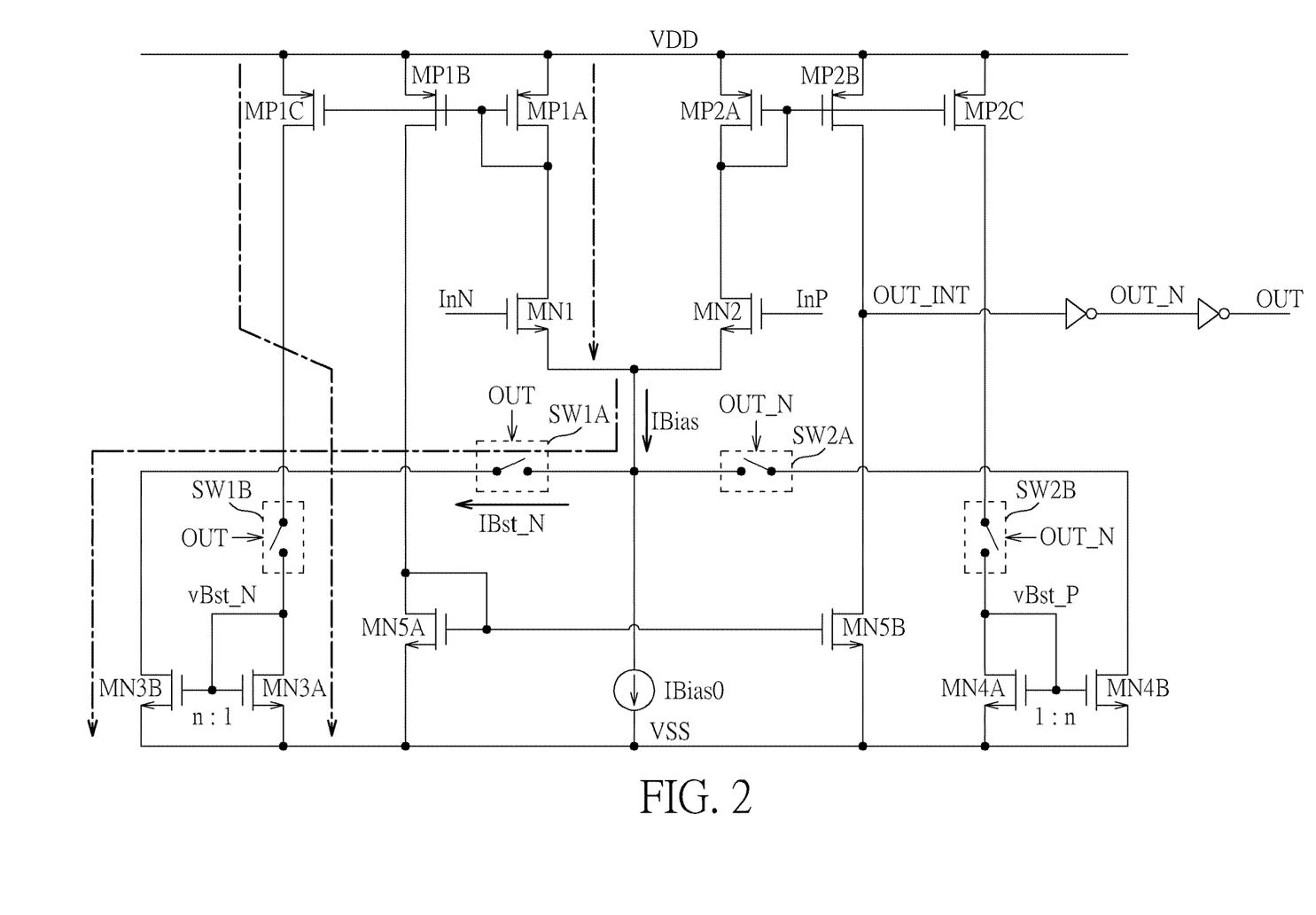
FIG. 2 illustrates a first positive feedback operation of the comparator circuit shown in FIG. 1 according to an embodiment of the present invention.

FIG. 2 illustrates a first positive feedback operation of the comparator circuit 100 shown in FIG. 1 according to an embodiment of the present invention. The first positive feedback circuit may comprise the switch SW1A coupled to the node and a set of transistors MP1C, MN3A and MN3B coupled between the power voltage VDD and ground voltage VSS, and may comprise the switch SW1B coupled between the transistors MP1C and MN3A. By utilizing a certain comparison signal within the aforementioned at least one comparison signal, such as the comparison signal OUT, the comparator circuit 100 may enable or disable the first positive feedback circuit, and more particularly, may turn on or turn off the switches SW1A and SW1B to correspondingly conduct or cut off related current paths, such as a current path between the node and the transistor MN3B and a current path between the transistors MP1C and MN3A. When the comparison signal OUT is logic high (e.g. has a high voltage level), the comparator circuit 100 may turn on the switches SW1A and SW1B via the comparison signal OUT to correspondingly make these current paths conductive. When the comparison signal OUT is logic low (e.g. has a low voltage level), the comparator circuit 100 may turn off the switches SW1A and SW1B via the comparison signal OUT to correspondingly cut off these current paths. Thus, the switches SW1A and SW1B may enable or disable the first positive feedback circuit in response to a transition of the aforementioned at least one comparison signal.

For example, when the first positive feedback circuit is enabled, a first current such as the current IBst_N may flow through the switch SW1A and the transistor MN3B; more particularly, the first current such as the current IBst_N may start from the input stage 110 as illustrated by a corresponding dashed arrow, where the current IBst_N may be regarded as a sub-current of the current IBias. The set of transistors MP1C, MN3A and MN3B may generate the first current and a second current corresponding to each other. When the first positive feedback circuit is enabled, the second current flows through the transistor MP1C, the switch SW1B and the transistor MN3A as illustrated by a corresponding dashed arrow, where an instant current within the instant currents (e.g. an instant current flowing through the first set of transistors MP1A and MN1 as illustrated by a corresponding dashed arrow) may correspond to the second current, and more particularly, this instant current may keep flowing to the node to form positive feedback, but the present invention is not limited thereto.

As shown in FIG. 2, a first terminal, a second terminal and a control terminal (e.g. a drain terminal, a source terminal and a gate terminal) of the transistor MN3A may be respectively coupled to a second terminal (e.g. a drain terminal) of the transistor MP1C, the ground voltage VSS and a control terminal (e.g. a gate terminal) of the transistor MN3B, and a first terminal and a control terminal (e.g. a source terminal and a gate terminal) of the transistor MP1C may be respectively coupled to the power voltage VDD and the control terminal (e.g. the gate terminal) of the transistor MP1A within the first set of transistors MN1 and MP1A. The first terminal and the control terminal (e.g. the drain terminal and the gate terminal) of the transistor MN3A may be coupled to each other to make the transistor MN3A be configured as a diode-connected transistor, and a first terminal and a second terminal (e.g. a drain terminal and a source terminal) of the transistor MN3B may be respectively coupled to the switch SW1A and the ground voltage VSS, where the transistors MN3A and MN3B may have a same gate voltage such as a voltage VBst_N. In addition, a ratio of respective specific parameters of the transistors MN3B and MN3A (e.g. respective channel width thereof) may be equal to n, to make the first current flowing through the transistor MN3B be n times the second current flowing through the transistor MN3A, where n is greater than one. Accordingly, the comparator circuit 100 may generate a corresponding instant current at the moment of the transition of the set of input signals InN and InP in time. Due to n times magnification via the transistors MN3B and MN3A, this instant current may be quite sufficient. Thus, the comparator circuit 100 can provide the corresponding instant current via the first positive feedback circuit, to make the comparator switch the output signal (such as the aforementioned at least one comparison signal) in response to the transition of the set of input signals InN and InP in real time, and thereby achieve the extremely high response speed.

Figure 3:
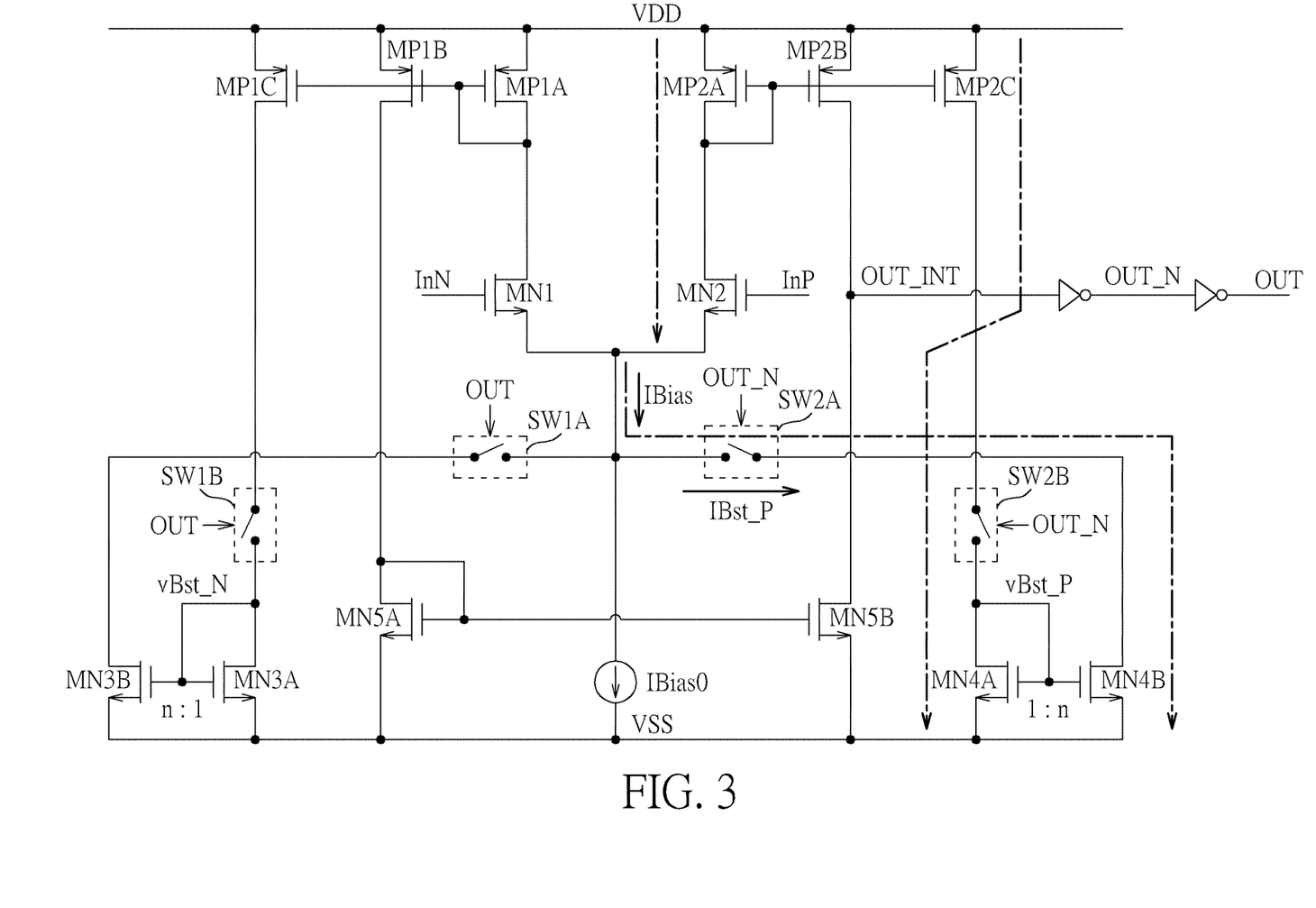
FIG. 3 illustrates a second positive feedback operation of the comparator circuit shown in FIG. 1 according to an embodiment of the present invention.

FIG. 3 illustrates a second positive feedback operation of the comparator circuit 100 shown in FIG. 1 according to an embodiment of the present invention. The second positive feedback circuit may comprise the switch SW2A coupled to the node and a set of transistors MP2C, MN4A and MN4B coupled between the power voltage VDD and the ground voltage VSS, and may comprise the switch SW2B coupled between the transistors MP2C and MN4A. By utilizing a certain comparison signal within the aforementioned at least one comparison signal, such as the comparison signal OUT_N, the comparator circuit 100 may enable or disable the second positive feedback circuit, and more particularly, may turn on or turn off the switches SW2A and SW2B to correspondingly conduct or cut off related current paths, such as a current path between the node and the transistor MN4B and a current path between the transistors MP2C and MN4A. When the comparison signal OUT_N is logic high (e.g. has the high voltage level), the comparator circuit 100 may turn on the switches SW2A and SW2B via the comparison signal OUT_N to correspondingly make these current paths conductive. When the comparison signal OUT_N is logic low (e.g. has the low voltage level), the comparator circuit 100 may turn off the switches SW2A and SW2B via the comparison signal OUT_N to correspondingly cut off these current paths. Thus, the switches SW2A and SW2B may enable or disable the second feedback circuit in response to a transition of the aforementioned at least one comparison signal.

For example, when the second positive feedback circuit is enabled, a first current such as the current IBst_P may flow through the switch SW2A and the transistor MN4B; more particularly, the first current such as the current IBst_P may start from the input stage 110 as illustrated by a corresponding dashed arrow, where the current IBst_P may be regarded as a sub-current of the current IBias. The set of transistors MP2C, MN4A and MN4B may generate the first current and a second current corresponding to each other. When the second positive feedback circuit is enabled, the second current flows through the transistor MP2C, the switch SW2B and the transistor MN4A as illustrated by a corresponding dashed arrow, where an instant current within the instant currents (e.g. an instant current flowing through the second set of transistors MP2A and MN2 as illustrated by a corresponding dashed arrow) may correspond to the second current, and more particularly, this instant current may keep flowing to the node to form positive feedback, but the present invention is not limited thereto.

As shown in FIG. 3, a first terminal, a second terminal and a control terminal (e.g. a drain terminal, a source terminal and a gate terminal) of the transistor MN4A may be respectively coupled to a second terminal (e.g. a drain terminal) of the transistor MP2C, the ground voltage VSS and a control terminal (e.g. a gate terminal) of the transistor MN4B, and a first terminal and a control terminal (e.g. a source terminal and a gate terminal) of the transistor MP2C may be respectively coupled to the power voltage VDD and the control terminal (e.g. the gate terminal) of the transistor MP2A within the second set of transistors MN2 and MP2A. The first terminal and the control terminal (e.g. the drain terminal and the gate terminal) of the transistor MN4A may be coupled to each other to make the transistor MN4A be configured as a diode-connected transistor, and a first terminal and a second terminal (e.g. a drain terminal and a source terminal) of the transistor MN4B may be respectively coupled to the switch SW2A and the ground voltage VSS, where the transistors MN4A and MN4B may have a same gate voltage such as a voltage VBst_P. In addition, a ratio of respective specific parameters of the transistors MN4B and MN4A (e.g. respective channel width thereof) may be equal to n, to make the first current flowing through the transistor MN4B be n times the second current flowing through the transistor MN4A, where n is greater than one. Accordingly, the comparator circuit 100 may generate a corresponding instant current at the moment of the transition of the set of input signals InN and InP in time. Due to the n times magnification via the transistors MN4B and MN4A, this instant current may be quite sufficient. Thus, the comparator circuit 100 can provide the corresponding instant current via the second positive feedback circuit, to make the comparator switch the output signal such as the aforementioned at least one comparison signal in response to the transition of the set of input signals InN and InP in real time, and thereby achieve the extremely high response speed.

According to some embodiments, at a first time point, a voltage level of the input signal InN is less than a voltage level of the input signal InP. When the voltage level of the input signal InN increases and approaches (e.g. becomes close to) the voltage level of the input signal InP, a current flowing into the switch SW1A rapidly increases until saturation. At a second time point, the voltage level of the signal InP is less than the voltage level of the input signal InN. When the voltage level of the input signal InP increases and approaches (e.g. becomes close to) the voltage level of the input signal InN, a current flowing into the switch SW2A rapidly increases until saturation.

Figure 4:
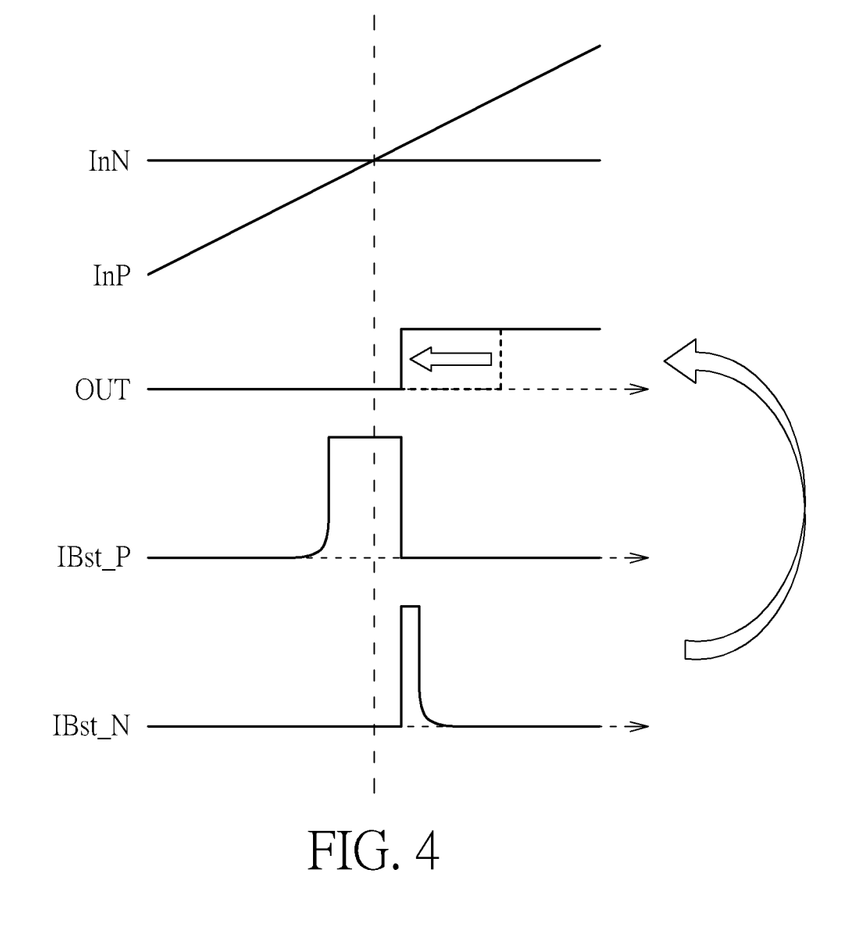
FIG. 4 illustrates implementation details of the first positive feedback operation shown in FIG. 2 according to an embodiment of the present invention.

FIG. 4 illustrates implementation details of the first positive feedback operation shown in FIG. 2 according to an embodiment of the present invention. The current IBst_N may carry the instant current generated by the first positive feedback circuit in the first positive feedback operation. The first positive feedback circuit may amplify this instant current via positive feedback, to switch the aforementioned at least one comparison signal such as the comparison signal OUT in time. A thick dashed line near the comparison signal OUT shown in FIG. 4 indicates a lag waveform of the comparison signal OUT under a condition where the first positive feedback operation does not take effect (e.g. the first positive feedback circuit is temporarily disabled or not implemented). As shown in FIG. 4, the first positive feedback circuit may shift a transition edge of the lag waveform from a lag time point to an earlier time point close to a transition time point of the set of input signals InN and InP. The comparator circuit 100 can provide this instant current via the first positive feedback circuit, to make the comparator switch the output signal such as the aforementioned at least one comparison signal in response to the transition of the set of input signals InN and InP in real time, and thereby achieve the extremely high response speed.

Figure 5:
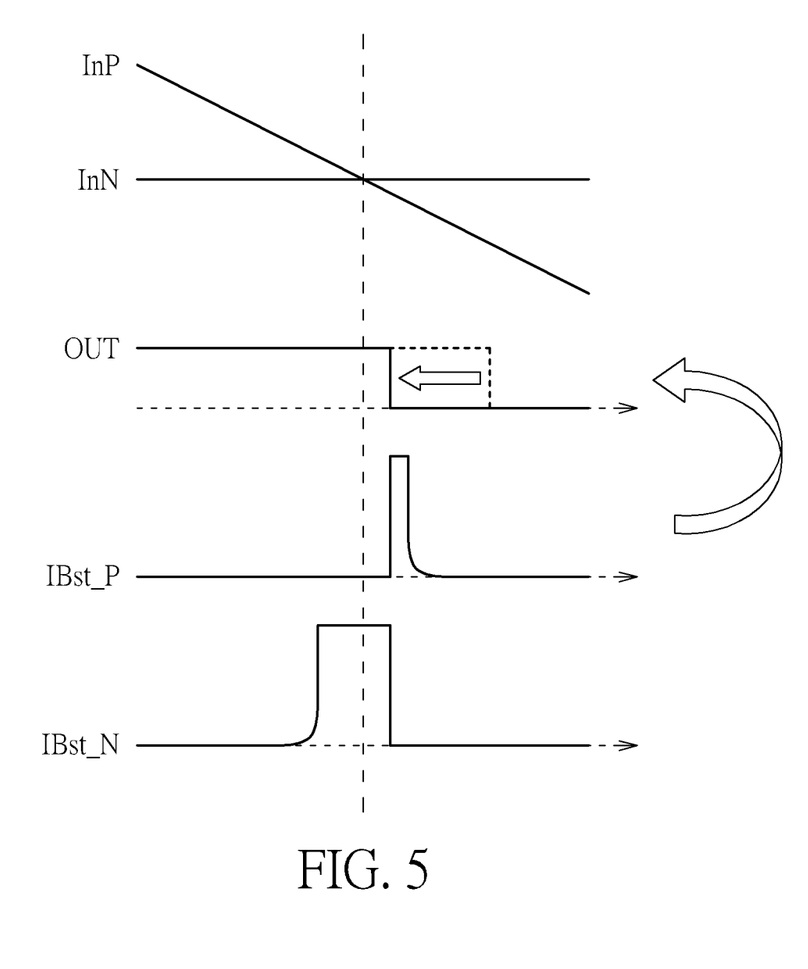
FIG. 5 illustrates implementation details of the second positive feedback operation shown in FIG. 3 according to an embodiment of the present invention.

FIG. 5 illustrates implementation details of the second positive feedback operation shown in FIG. 3 according to an embodiment of the present invention. The current IBst_P may carry the instant current generated by the second positive feedback circuit in the second positive feedback operation. The second positive feedback circuit may amplify this instant current via positive feedback, to switch the aforementioned at least one comparison signal such as the comparison signal OUT in time. A thick dashed line near the comparison signal OUT shown in FIG. 5 indicates a lag waveform of the comparison signal OUT under a condition where the second positive feedback operation does not take effect (e.g. the second positive feedback circuit is temporarily disabled or not implemented). As shown in FIG. 5, the second positive feedback circuit may shift a transition edge of the lag waveform from a lag time point to an earlier time point close to a transition time point of the set of input signals InN and InP. The comparator circuit 100 can provide this instant current via the second positive feedback circuit, to make the comparator switch the output signal such as the aforementioned at least one comparison signal in response to the transition of the set of input signals InN and InP in real time, and thereby achieve the extremely high response speed.

Figure 6:
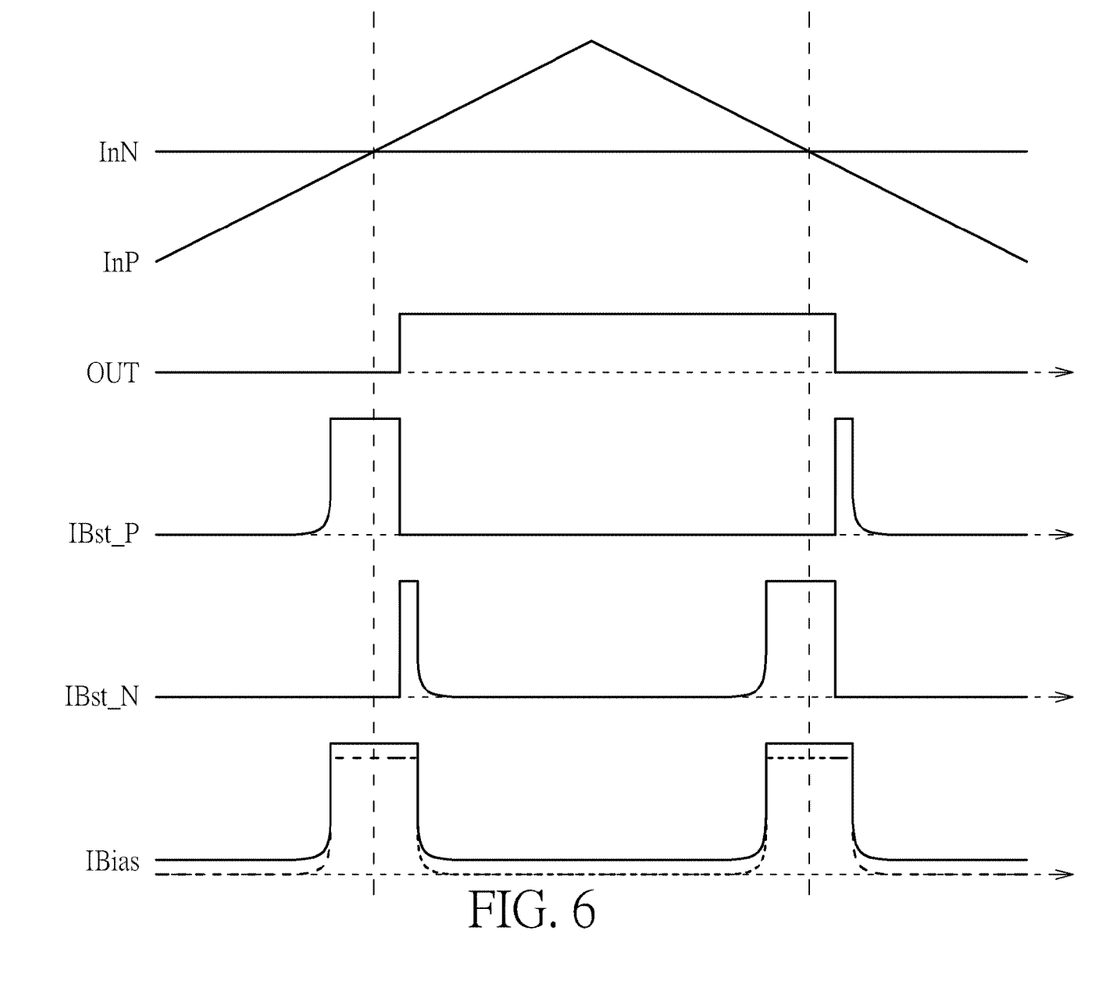
FIG. 6 illustrates related signals according to an embodiment of the present invention.

FIG. 6 illustrates related signals according to an embodiment of the present invention. The sub-currents of the current IBias may comprise the currents IBias0, IBst_P and IBst_N. Thick dashed lines shown in the bottom of FIG. 6 indicate a waveform of a summation current of the currents IBst_N and IBst_P, where different types of dashed lines within these thick dashed lines may respectively correspond to the currents IBst_P and IBst_N. Since the current IBias is equal to a summation of the currents IBias0, IBst_P and IBst_N, i.e. a summation of the current IBias0 and the summation current, an offset of the current IBias relative to the summation current is equal to the current IBias0. For brevity, similar descriptions for this embodiment are not repeated in detail here.

According to some embodiments, the instant current carried by the current IBst_P and the instant current carried by the current IBst_N may be much greater than the current IBias0. For example, the current IBias0 may have a predetermined current value, such as 5 nA (nanoamperes), and respective current values of these instant currents may reach 200 nA, but the present invention is not limited thereto.

According to some embodiments, the comparator circuit 100 may utilize the comparison signals OUT and OUT_N that are inverted signals of each other to alternatively enable or disable the first positive feedback circuit and the second positive feedback circuit, and more particularly, alternatively turn on or turnoff a first set of switches SW1A and SW1B within the first positive feedback circuit and a second set of switches SW2A and SW2B within the second positive feedback circuit. For example, when the second set of switches SW2A and SW2B are turned on, the comparator circuit 100 turns off the first set of switches SW1A and SW1B; and when the first set of switches SW1A and SW1B are turned on, the comparator circuit 100 turns off the second set of switches SW2A and SW2B. When the voltage levels of the set of input signals InN and InP are close to each other, the comparator circuit 100 may utilize a certain positive feedback circuit within the positive feedback circuit (such as the first positive feedback circuit or the second positive feedback circuit) to generate a big bias current (such as an instant current amplified by positive feedback) for the input stage 110, and reduce propagation delay via this big bias current to achieve the extremely high response speed. After the comparator switches, the voltage levels of the set of input signals InN and InP deviate from each other. Under this condition, a bias current recovers to the current IBias0 again. The bias current of the comparator may be increased when the voltage levels of the set of input signals InN and InP are close to each other only, and be reduced to a small constant current (such as the current IBias0) after the voltage levels of the set of input signals InN and InP deviate from each other. For brevity, similar descriptions for this embodiment are not repeated in detail here.

According to some embodiments, the architecture shown in FIG. 1 may be applied to various types of circuit designs that need a comparator, e.g. a phase-locked loop (PLL), an oscillator, a power management circuit, and an analog-to-digital converter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A comparator circuit, comprising:
a comparator, coupled between a power voltage and a ground voltage, configured to perform a comparison according to a set of input signals to generate at least one comparison signal, wherein the comparator comprises:
  a set of input terminals, configured to receive the set of input signals;
  a first set of transistors, coupled between the power voltage and a node, wherein a first terminal, a second terminal and a control terminal of a transistor within the first set of transistors are respectively coupled to a second terminal of another transistor within the first set of transistors, the node and an input terminal within the set of input terminals, and a first terminal of the other transistor within the first set of transistors is coupled to the power voltage;
  a second set of transistors, coupled between the power voltage and the node, wherein a first terminal, a second terminal and a control terminal of a transistor within the second set of transistors are respectively coupled to a second terminal of another transistor within the second set of transistors, the node and another input terminal within the set of input terminals, and a first terminal of the other transistor within the second set of transistors is coupled to the power voltage;
  a third set of transistors, coupled between the power voltage and the ground voltage, wherein a first terminal, a second terminal and a control terminal of a transistor within the third set of transistors are respectively coupled to a second terminal of another transistor within the third set of transistors, the ground voltage and an output stage of the comparator, and a first terminal and a control terminal of the other transistor within the third set of transistors are respectively coupled to the power voltage and a control terminal of the other transistor within the first set of transistors; and
  a fourth set of transistors, coupled between the power voltage and the ground voltage and positioned in the output stage, wherein a first terminal, a second terminal and a control terminal of a transistor within the fourth set of transistors are respectively coupled to a second terminal of another transistor within the fourth set of transistors, the ground voltage and the control terminal of the transistor within the third set of transistors, and a first terminal and a control terminal of the other transistor within the fourth set of transistors are respectively coupled to the power voltage and a control terminal of the other transistor within the second set of transistors;
a current source, coupled between the node and the ground voltage, configured to provide current; and
a plurality of positive feedback circuits, coupled between the power voltage and the ground voltage and coupled to the node, configured to perform a plurality of positive feedback operations on the node to generate a plurality of instant currents on the node, respectively, to make the comparator switch said at least one comparison signal in response to a transition of the set of input signals in real time, wherein any positive feedback circuit within the positive feedback circuits comprises:
  a first switch, coupled to the node, configured to enable or disable said any positive feedback circuit in response to a transition of said at least one compari- son signal, wherein when said any positive feedback circuit is enabled, a first current flows through the first switch; and a set of transistors, coupled between the power voltage and the ground voltage, configured to generate the first current and a second current corresponding to each other, wherein an instant current within the instant currents corresponds to the second current.

2. The comparator circuit of claim 1, wherein when said any positive feedback circuit is enabled, the second current flows through a first transistor and a second transistor within the set of transistors, and the first current flows through a third transistor within the set of transistors.

3. The comparator circuit of claim 2, wherein a first terminal, a second terminal and a control terminal of the first transistor are respectively coupled to a second terminal of the second transistor, the ground voltage and a control terminal of the third transistor, and a first terminal and a control terminal of the second transistor are respectively coupled to the power voltage and the control terminal of the other transistor within the first set of transistors.

4. The comparator circuit of claim 3, wherein the first terminal and the control terminal of the first transistor are coupled to each other, to make the first transistor be configured as a diode-connected transistor; and a ratio of respective specific parameters of the third transistor and the first transistor is equal to n, to make the first current flowing through the third transistor be n times the second current flowing through the first transistor, wherein n is greater than one.

5. The comparator circuit of claim 2, wherein a first terminal, a second terminal and a control terminal of the first transistor are respectively coupled to a second terminal of the second transistor, the ground voltage and a control terminal of the third transistor, and a first terminal and a control terminal of the second transistor are respectively coupled to the power voltage and the control terminal of the other transistor within the second set of transistors.

6. The comparator circuit of claim 5, wherein the first terminal and the control terminal of the first transistor are coupled to each other, to make the first transistor be configured as a diode-connected transistor; and a ratio of respective specific parameters of the third transistor and the first transistor is equal to n, to make the first current flowing through the third transistor be n times the second current flowing through the first transistor, wherein n is greater than one.

7. The comparator circuit of claim 2, wherein a first terminal and a second terminal of the third transistor are respectively coupled to the first switch and the ground voltage.

8. The comparator circuit of claim 2, wherein said any positive feedback circuit comprises:

a second switch, coupled between the first transistor and the second transistor, configured to enable or disable said any positive feedback circuit in response to the transition of said at least one comparison signal, wherein when said any positive feedback circuit is enabled, the second current flows through the second switch.

9. The comparator circuit of claim 1, wherein the positive feedback circuits comprise:

a first positive feedback circuit, coupled between the power voltage and the node, configured to perform a first positive feedback operation within the positive feedback operations on the node to generate a first instant current within the instant currents on the node; and a second positive feedback circuit, coupled between the power voltage and the node, configured to perform a second positive feedback operation within the positive feedback operations on the node to generate a second instant current within the instant currents on the node;

wherein the first instant current and the second instant current respectively correspond to a first transition and a second transition of the set of input signals.

10. The comparator circuit of claim 1, wherein the control terminal and the second terminal of the other transistor within the first set of transistors are coupled to each other, to make the other transistor within the first set of transistors be configured as a diode-connected transistor; and the control terminal and the second terminal of the other transistor within the second set of transistor are coupled to each other, to make the other transistor within the second set of transistors be configured as a diode-connected transistor.

* * * * *